United States Patent [19]

Noma

[11] Patent Number: 4,523,098

[45] Date of Patent: Jun. 11, 1985

[54] ELECTRON BEAM EXPOSURE APPARATUS

[75] Inventor: Akira Noma, Yokohama, Japan

[73] Assignee: Tokyo Shibaura Denki Kabushiki Kaisha, Japan

[21] Appl. No.: 559,287

[22] Filed: Dec. 8, 1983

Related U.S. Application Data

[63] Continuation of Ser. No. 287,813, Jul. 28, 1981, abandoned.

[30] Foreign Application Priority Data

Aug. 8, 1980 [JP] Japan ................................ 55-108917

[51] Int. Cl.³ .............................................. H01J 37/00
[52] U.S. Cl. ................................................. 250/492.2
[58] Field of Search ............................ 250/398, 492.2; 219/121 EL, 121 EM

[56] References Cited

U.S. PATENT DOCUMENTS

| | | | |
|---|---|---|---|
| 4,132,898 | 1/1979 | Buelow et al. | 250/492.2 |
| 4,267,456 | 5/1981 | Hidai et al. | 250/492.2 |
| 4,363,953 | 12/1982 | Katsuta et al. | 250/492.2 |
| 4,393,312 | 7/1983 | Collier et al. | 250/492.2 |

Primary Examiner—Bruce C. Anderson
Attorney, Agent, or Firm—Finnegan, Henderson, Farabow, Garrett & Dunner

[57] ABSTRACT

An electron beam exposure apparatus designed to expose the surface of an electron sensitive photo-mask or the like in response to exposure patterns is provided. The pattern to be exposed is divided into stripe areas whose width in the beam scanning direction is determined in such a way that as many stripe areas as possible have the same pattern. The width of each such stripe area is stored in memory to permit successive exposure of each stripe area.

6 Claims, 8 Drawing Figures

ELECTRON BEAM EXPOSURE APPARATUS

This is a continuation of application Ser. No. 287,813, filed July 28, 1981, abandoned.

BACKGROUND OF THE INVENTION

This invention relates to an electron beam exposure apparatus.

An electron beam exposure apparatus is used as shown in FIG. 1 in the prior art to form a pattern on a semiconductor wafer or a photo-mask. To form a pattern on, for example, an electron sensitive photo-mask 112, the mask is put on an X-Y stage (not shown) which is placed opposite to an electron gun 114. Electron gun 114 emits an electron beam 116, which scans the pattern area 110 of photo-mask 112. The electron beam passes through blanking electrodes (not shown) and deflection electrodes 118 which govern the intensity and position of the beam. These electrodes are controlled by exposure pattern data to assure that the correct pattern is placed on the photo-mask.

The electron beam 116 may be moved a limited maximum distance W in a first direction (X direction) by operation of deflection electrodes 118. This first direction may be referred to as the "scanning" direction. The photo-mask 112 may be moved in a second direction (Y-direction) perpendicular to the scanning direction. The scanning distance W is typically shorter than the X-direction width of photo-mask 112. Accordingly, a narrow stripe 120 is formed which is equal in width to the maximum scanning distance W. During such a scan, the intensity of the electron beam is controlled by the exposure pattern data. Furthermore, upon finishing the scanning of a stripe area 120 of the mask, the mask is shifted in the scanning direction (X-direction) so that the electron beam may scan a next stripe area 122. This process continues until the entire pattern area 110 is scanned.

Known electron beam exposure apparatus are used to form a pattern on the mask in the following manner. The surface of the mask is divided into a plurality of stripe areas, for example stripe areas 120, 122, 124, 126 and 128. Each stripe area has a width of W, which for example, may be 256 um, the largest width over which the electron beam can scan with permissive distortion when deflected by deflection electrodes 118. Each stripe area may be further divided along its length into cells. For example, in FIG. 1, stripe area 124 is shown being divided into four cells, each having a Y-direction length "a" equal to 256 um to form square cells of 256 um×256 um. Each cell in a stripe area is sequentially exposed to the electron beam.

Therefore, to form a pattern on the mask by the known apparatus it is necessary to have data available which represents the content of each of the 256 um×256 um cells. Such data is obtained by analyzing the pattern content in each cell. As mentioned above, the X-direction width of each cell is determined by the longest distance over which the electron beam can scan with permissive distortion. Thus, even if the pattern to be placed on the mask contains many identical subpatterns as does the pattern for a typical semiconduct memory or logic circuit, this repetitiousness cannot be utilized unless the subpatterns have the same 256×256 um dimensions as the cells formed by the movement of the electron beam.

It takes a long time to develop the correct exposure pattern data for a large mask if there is no repetitive pattern in the pattern which corresponds to the cell size. The time required for this data development is longer than the time required for the apparatus to expose the entire mask. This means that the known apparatus cannot be used with a high efficiency. Further, since all the data representing identical subpatterns must be individually stored unless the subpatterns have the same size and location as a corresponding cell, the electron beam apparatus must have the capacity for storing a large amount of exposure pattern data.

SUMMARY OF THE INVENTION

It is an object of this invention to provide an electron beam exposure apparatus which makes it possible to convert exposure pattern data into cell pattern data in a short time, simply by changing the width of each exposure cell.

The object is achieved by an apparatus which comprises means for storing exposure pattern data representing the individual width in the beam scanning direction and data representing the pattern content of a plurality of stripe areas, these stripe areas dividing the surface of the subject to be exposed in a direction perpendicular to the electron beam scanning direction, with the width of each such stripe area independently selected as a function of the pattern to be exposed on the surface of the subject to maximize any repetitive nature of the pattern in each stripe area, means for exposing each stripe area with the electron beam in accordance with the exposure pattern data and means for shifting the subject in the beam scanning direction in response to the stored width data, for a distance equal to the width of the stripe area upon completion of exposure of that stripe area.

DETAILED DESCRIPTION OF THE PREFERRED EMBODIMENTS

An electron beam exposure apparatus according to this invention will now be described with reference to the accompanying drawings.

Figure 2:
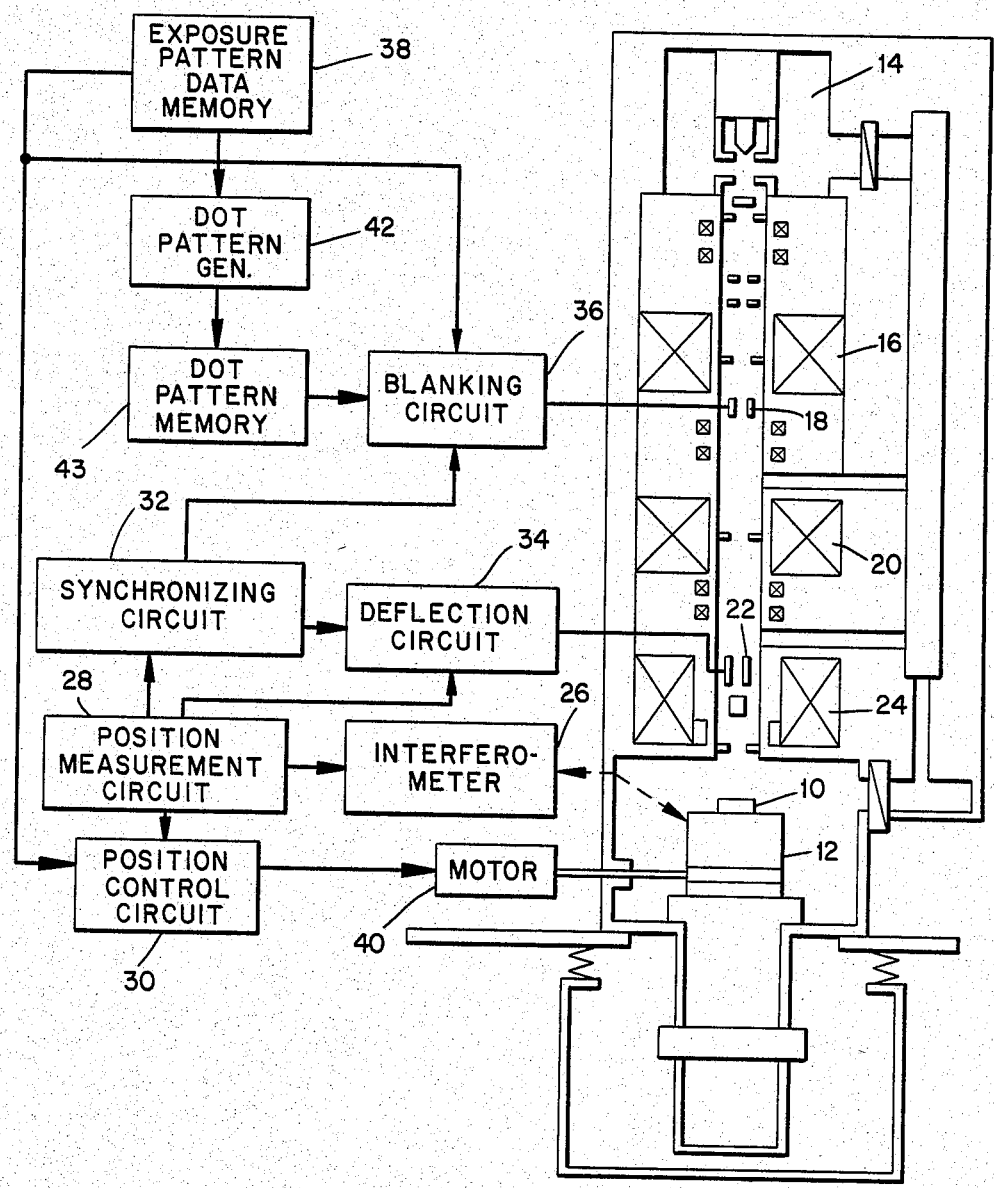
FIG. 2 shows an embodiment of the present invention.

As shown in FIG. 2, an electron gun 14 is located opposite to an X-Y stage 12 on which a photo-mask 10 is mounted. The electron gun 14 emits an electron beam, which is applied onto the photo-mask 10 through a first condenser lens 16, blanking electrodes 18, a second condenser lens 20, deflection electrodes 22 and an objective lens 24. Provided respectively on the X and Y sides of the stage 12 are plane mirrors (not shown).

Further provided is a laser interferometer 26 for detecting the position of the X-Y stage 12.

The output of the laser interferometer 26 is supplied to a position measurement circuit 28. The output of the circuit 28 is fed to a position control circuit 30, a synchronizing circuit 32 and a deflection circuit 34. The output of the circuit 32 is supplied to the deflection circuit 34 and also to a blanking circuit 36. The output of the circuit 34 is supplied to the deflection electrodes 22.

Further provided is an exposure pattern data memory 38 which stores exposure pattern data representing individual cells defined by dividing the surface of the photo-mask 10. The memory 38 has two output terminals. The first output terminal is connected to the blanking circuit 36 and the position control circuit 30, and the second output terminal is connected to a dot pattern generator 42. The output of the position control circuit 30 is fed to a motor 40 for moving the X-Y stage 12. The output of the dot pattern generator 42 is stored into a dot pattern memory 43. The output of the memory 43 is supplied to the blanking circuit 36, the output of which is fed to the blanking electrodes 18.

Figure 1:
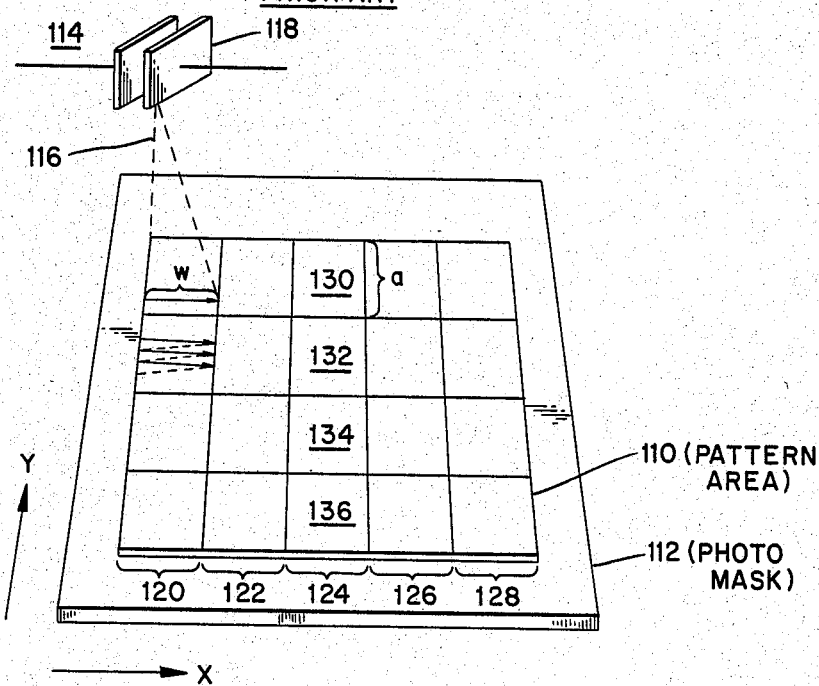
FIG. 1 shows an example of prior art cell division.
Figure 3:
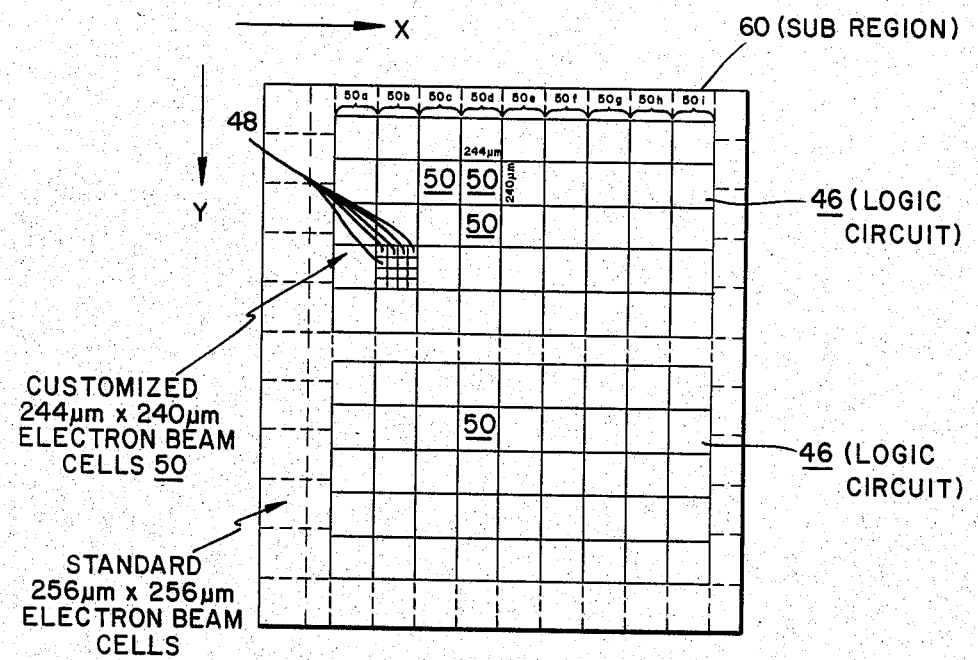
FIG. 3 shows comparative examples of cell division using the prior art and the teachings of the subject invention.
Figure 4:
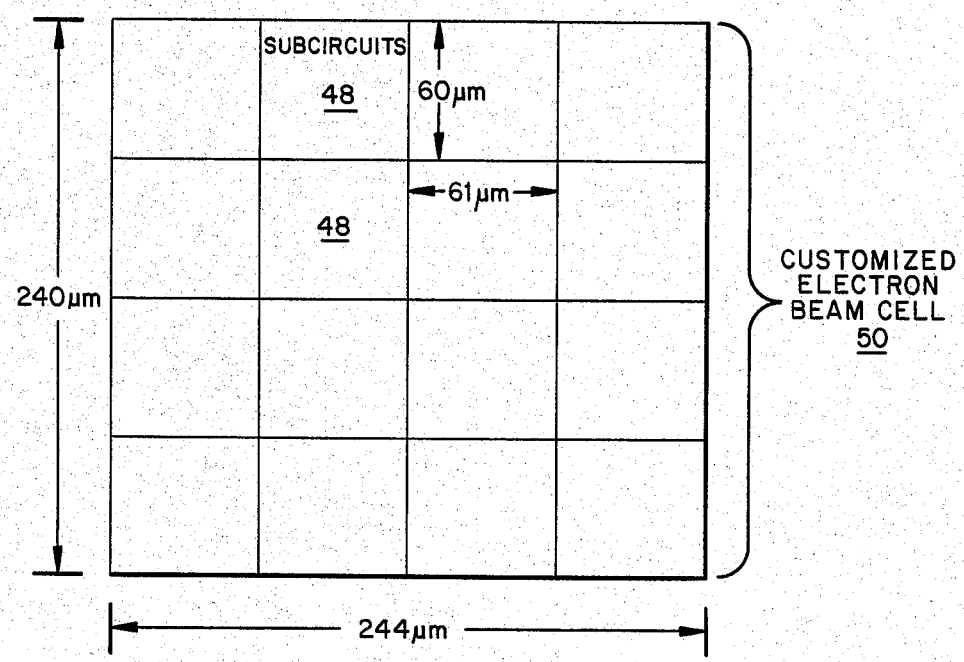
FIG. 4 shows one example of the subcircuits of each cell.

Now the exposure pattern data will be described. The pattern area of the photo-mask includes a large number of subregions each corresponding to one IC device. FIGS. 3 and 4 show how to divide the exposed surface of the subregion 60 into cells. Suppose a pattern of an IC logic circuit 46 as shown in FIG. 3 (such as a plurality of transistors which store logic data) is to be printed on the surface of subregion 60. The circuit 46 has a plurality of subcircuits 48, each constituted by a transistor and a capacitor and having a size, for example, of 60 um × 61 um. The surface of the subregion 60 may be divided into a plurality of electron beam cells each having the size of a subcircuit 48, namely 60 um × 61 um. If the surface of the subregion 60 is so divided, it would take a long time to complete the exposure of the subregion 60.

However, the longest distance over which the electron beam can scan is 256 um. Thus, the pattern of every 16 (=4×4) subcircuits may be grouped into one customized electron beam cell 50. More specifically, the pattern of each logic circuit 46 is divided into stripe areas 50 a–i which extend in the Y direction and which have a width in the X-direction of 244 um (4 subcircuits × 61 um/subcircuit), and further each stripe area 50 a–i is divided in the Y-direction into cells 50 which have a length of 240 um (4 subcircuits × 60 um/subcircuit).

In FIG. 3, broken lines show how the surface of the subregion 60 is divided into standard cells, each having a size of 256 um × 256 um, and solid lines show how the pattern of each logic circuit 46 is divided into customized cells, each having a size of 244 um × 240 um. Thus, each stripe area of the pattern of logic circuit 46 may be divided into customized cells 50 having different lengths.

Figure 5:
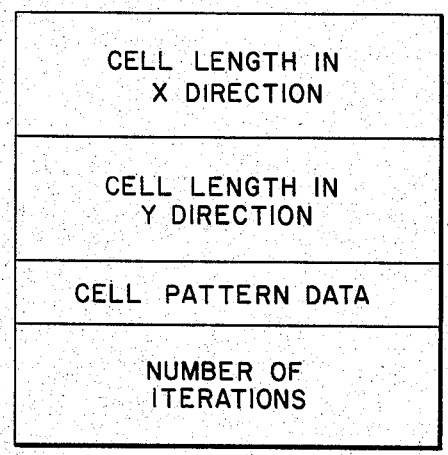
FIG. 5 is a table showing data stored in an exposure data memory.

As shown in FIG. 5, the exposure pattern data memory 38 has an exposure data table including four sections in which there is stored data indicating a cell length in the X direction, cell length in the Y direction, cell pattern data and number of iterations, respectively.

If some exposure pattern data of any cells in one stripe area are identical, data is prepared and stored for only the first cell. In this case, the number of iterations is prepared for the first cell alone, which is equal to the number of the following cells whose exposure patterns are identical. The exposure pattern data is not prepared for the rest of the successive cells. The number of iterations represents that of successive cells whose exposure patterns are the same.

Figure 6:
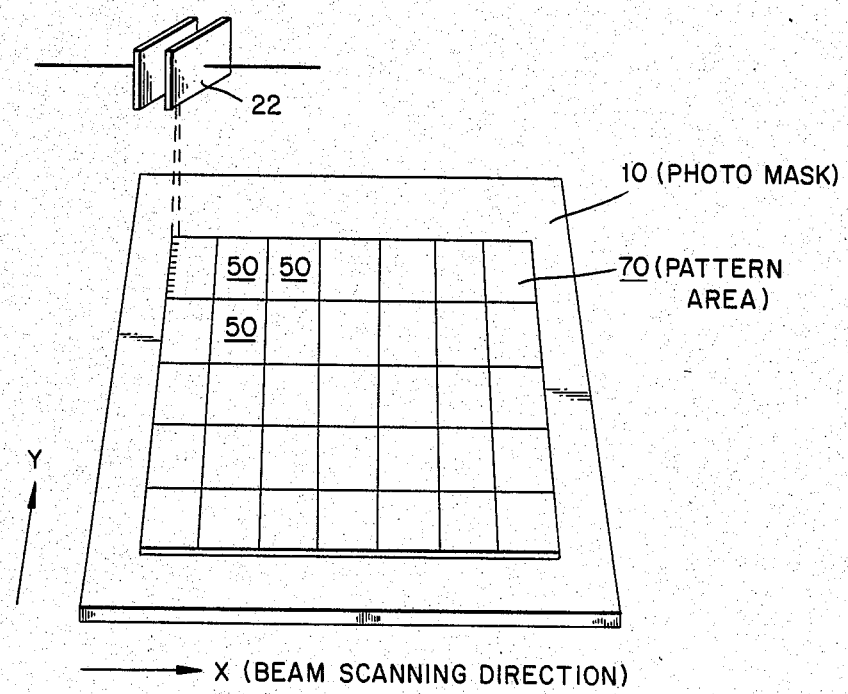
FIG. 6 illustrates how the embodiment of FIG. 2 performs its function.

Now it is assumed that, as shown in FIG. 6, the electron beam scanning is carried out in the X direction. The surface of the pattern area 70 is divided into subregions 60 and each subregion 60 is divided into stripe areas extending in the Y direction. Further each of the stripe areas is divided into a plurality of customized electron beam cells 50. Through its first output terminal the exposure pattern data memory 38 supplies the blanking circuit 36 and position control circuit 30 with data which represents the Y direction lengths of the cells. Through its second output terminal the memory 38 supplies other data to the dot pattern generator 42. The size of the cells is thus determined and in such a way that as many cell patterns as possible may be the same.

It is further assumed that the electron beam lands on the photo-mask 10 at the origin (X=0, Y=0). The dot pattern generator 42 produces dot pattern data upon receiving exposure pattern data from the memory 38. The dot pattern data is stored into the dot pattern memory 43 and supplied to the blanking circuit 36.

Figure 7:
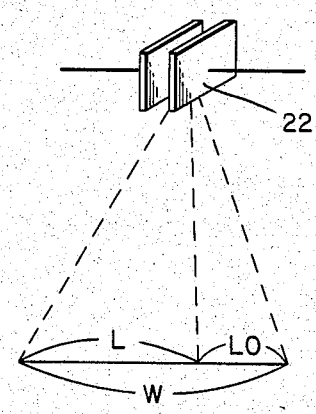
FIG. 7 shows how an electron beam scans a subject.

In FIG. 7, W is the maximum scanning length (e.g., 256 um) over which the electron beam can scan. But the actual scanning length L is determined by the cell length in the X direction; namely by the width of each stripe area. Data showing this actual scanning length L is supplied to the blanking circuit 36. The circuit 36 carries out blanking on the portion L0 of each scanning line, which extends over the distance L in the X direction. The blanking for L0 is not affected by the exposure pattern data supplied to the blanking circuit 36 from the exposure pattern data memory 38, but is affected by the cell length in the X direction, unconditionally. The blanking circuit 36 further controls non-blanking and blanking of the electron beam on the portion L in response to the dot pattern data supplied from the dot pattern generator 42. The actual X direction cell length (width of each stripe area) can thus be changed by cell size data.

A pattern is printed on each stripe area in the following manner. First, the X-Y stage 12 is driven by the motor 40, moving in the Y direction at a constant speed. The electron beam is deflected at a prescribed position by the deflection electrode 22 in accordance with a signal from the position measurement circuit 28. The exposure pattern data is prepared prior to printing patterns on the cells. Pattern printing on the next cell is continuously performed according to the length of the cell measured in the Y direction.

Suppose the exposure pattern data table for a cell contains data showing the number of iterations. Then, upon completion of the exposure of one cell, the same pattern is printed on the following cells of the same stripe area, the number of which is identical with the number of iterations. When the exposure of the first stripe area is finished, the position control circuit 30 controls the motor 40, and moves the X-Y stage 12 in the X direction for the X direction cell length (width of the stripe area). Then, exposure of the next stripe area is started. Thereafter, exposure is similarly affected relative to every cell which has a size corresponding to the data of the exposure pattern data memory 38.

According to the present invention as described above, the dimension of cells can be determined in such a way that the pattern data of as many cells as possible are made same, thus allowing the same exposure pattern to be repeatedly used to thereby make it easy and quick to prepare the data table stored in the exposure pattern data memory 38.

Figure 8:
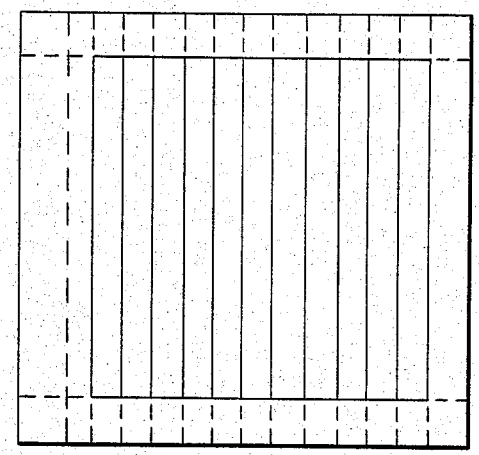
FIG. 8 shows another example of cell division.

It should be understood that the present invention is not limited to the embodiment described and shown, and that various modifications can be made in view of the data table and the like which are already exemplified in the specification. For example, as shown in FIG. 8, the surface of the photo-mask 10 may be divided into stripe areas each defining one cell, so that a cell pattern data need not be used repeatedly to expose each stripe area. In short, this invention resides in that an exposure pattern can be divided into stripe areas whose width in the X direction (i.e., electron beam scanning direction) is determined in such a way that as many stripes as possible have the same pattern. That is, the cell division can be affected, considering the iteration of exposure patterns.

What is claimed is:

1. An electron beam apparatus for exposing a pattern having a repetitive nature on the surface of a subject with an electron beam having an electron beam scanning direction and comprising:

means for storing data representing the individual width in the beam scanning direction and data representing the pattern content of a plurality of stripes, said stripes dividing the surface of the subject to be exposed in a direction perpendicular to the electron beam scanning direction, with the width of each such stripe independently selected as a function of the pattern to be exposed on the surface of the subject to maxmize the repetitive nature of the pattern in each stripe;

means of exposing each stripe with the electron beam in accordance with said pattern content data; and means for shifting the subject in said scanning direction in response to said width data, for a distance equal to the width of each stripe upon completion of exposure of that stripe.

2. An electron beam exposure apparatus, according to claim 1, wherein said means for storing stores pattern content data only for a first stripe when the pattern content data representing the patterns of successive stripes is the same, and uses this stored pattern content data repeatedly for successive stripes, starting with the second stripe of the pattern.

3. An electron beam exposing apparatus, according to claim 1, in which said memory means stores pattern content data and data representing the width in the scanning direction and the length perpendicular to the scanning direction for a plurality of different cells obtained by segmenting each of said stripes along the length of said stripes, and wherein said exposure means successively exposes each cell of a stripe.

4. An electron beam exposing apparatus according to claim 3 in which said memory means stores only the pattern content data of a first cell of a group of successive cells in a stripe when the pattern of successive cells is the same, and repeatedly uses this stored pattern content data for successive cells in a stripe, starting with the second cell of a stripe.

5. An electron beam exposing apparatus, according to claim 1, in which said exposing means repeatedly scans the electron beam on the subject in the beam scanning direction, said exposing means exposing each stripe with the electron beam during a first portion of each scan corresponding to the width of the stripe being scanned, and said exposing means blanking the electron beam during any remaining portion of the scan.

6. An electron beam exposing apparatus, according to claim 1, in which said electron beam exposing apparatus is a raster scan type.

* * * * *